(12) United States Patent
Yamada (10) Patent No.: US 8,050,075 B2
(45) Date of Patent: Nov. 1, 2011

(54) MEMORY (75) Inventor: Kouichi Yamada, Hashima-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 251 days.

(21) Appl. No.: 12/266,332

(22) Filed: Nov. 6, 2008

(65) Prior Publication Data

US 2009/0116271 A1 May 7, 2009

(30) Foreign Application Priority Data

Nov. 7, 2007 (JP) ................................ 2007-289792
Nov. 13, 2007 (JP) ................................ 2007-293823

(51) Int. Cl.
G11C 17/00 (2006.01)
G11C 8/00 (2006.01)

(52) U.S. Cl. .......... 365/94; 365/103; 365/104; 365/105; 365/230.03

(58) Field of Classification Search .................... 365/94, 365/103, 104, 105, 230.03
See application file for complete search history.

(56) References Cited

U.S. PATENT DOCUMENTS

| 4,598,386 | A | * | 7/1986 | Roesner et al. | 365/105 |
| 5,124,948 | A | * | 6/1992 | Takizawa et al. | 365/94 |
| 5,128,895 | A | * | 7/1992 | Park | 365/104 |
| 5,280,442 | A | * | 1/1994 | Hotta et al. | 365/94 |
| 5,392,233 | A | * | 2/1995 | Iwase | 365/104 |
| 5,561,624 | A | * | 10/1996 | Chen et al. | 365/104 |
| 5,666,304 | A | * | 9/1997 | Hikawa et al. | 365/104 |
| 5,793,666 | A | * | 8/1998 | Yamazaki | 365/104 |
| 5,986,918 | A | * | 11/1999 | Lee | 365/103 |
| 6,018,487 | A | * | 1/2000 | Lee et al. | 365/103 |
| 6,084,794 | A | * | 7/2000 | Lu et al. | 365/104 |
| 6,473,327 | B1 | * | 10/2002 | Ishizuka | 365/104 |
| 6,975,528 | B2 | * | 12/2005 | Do | 365/94 |
| 7,348,640 | B2 | | 3/2008 | Yamada | |

FOREIGN PATENT DOCUMENTS

| JP | 2005-268370 | 9/2005 |
| JP | 2006-208313 | 8/2006 |
| JP | 2007-005580 | 1/2007 |
| JP | 2007-018816 | 1/2007 |

* cited by examiner

Primary Examiner — Trong Phan
(74) Attorney, Agent, or Firm — McDermott Will & Emery LLP (57) ABSTRACT A memory is so formed that, in a first block and a second block each including a prescribed number of the bit lines arranged therein, positions of the bit lines simultaneously selected in the first and second blocks with reference to ends of the first and second blocks respectively are different from each other.

15 Claims, 5 Drawing Sheets

MEMORY

CROSS-REFERENCE TO RELATED APPLICATIONS

The priority application number JP2007-293823, Memory, Nov. 13, 2007, Kouichi Yamada, JP2007-289792, Memory, Nov. 7, 2007, Kouichi Yamada, upon which this patent application is based is herby incorporated by reference.

BACKGROUND OF THE INVENTION

1. Field of the Invention

The present invention relates to a memory, and more particularly, it relates to a memory comprising memory cells including diodes.

2. Description of the Background Art

A crosspoint mask ROM (hereinafter referred to as a diode ROM) having a plurality of memory cells, each including a diode, arranged in the form of a matrix is known in general as an exemplary memory.

In a conventional diode ROM, a plurality of word lines and a plurality of bit lines are arranged to intersect with each other in a memory cell array. These word lines and bit lines are connected to a row decoder and a column decoder respectively. An address input circuit, a row decoder, a column decoder, a sense amplifier and an output circuit are provided outside the memory cell array. A plurality of memory cells each including a diode are provided in the memory cell array. The plurality of memory cells are arranged in the form of a matrix along the plurality of word lines and the plurality of bit lines respectively, while a prescribed number of such memory cells are connected to each word line through the corresponding selection transistor. Cathodes of the diodes included in the prescribed number of the memory cells connected to the corresponding word line are connected to a common conductive line. Anodes of the diodes are connected to the bit lines.

In a conventional data read operation, the row decoder first changes the potentials of the plurality of the word lines on the basis of address data output from the address input circuit. The bit line corresponding to the selected memory cell is electrically connected to the sense amplifier by the column decoder on the basis of address data output from the address input circuit. Thus, the potential of the selected bit line is determined and amplified in the sense amplifier and an output circuit thereafter outputs a signal.

Dissimilarly to the structure in which the signals of the aforementioned memory cells are read through the bit lines, source lines provided to intersect with the plurality of word lines and electrically connected to the cathodes of the diodes through selection transistors may be provided and the signals of the memory cells included in the diodes may be read through the source lines. At this time, the sense amplifier is connected to the source lines, the potentials of the source lines are determined and amplified in the sense amplifier and the output circuit thereafter outputs the signals.

SUMMARY OF THE INVENTION

A memory according to a first aspect comprises a plurality of word lines, a plurality of bit lines arranged so as to intersect with the plurality of word lines, conductive lines provided so as to extend parallel to the word lines and memory cells arranged on intersectional positions between the conductive lines and the bit lines, wherein in a first block and a second block each including a prescribed number of the bit lines arranged therein, positions of the bit lines simultaneously selected in the first and second blocks with reference to ends of the first and second blocks respectively are different from each other.

A memory according to a second aspect comprises a plurality of word lines, a plurality of bit lines arranged so as to intersect with the plurality of word lines, conductive lines provided so as to extend parallel to the word lines, memory cells arranged on intersectional positions between the conductive lines and the bit lines and a plurality of transistors provided every prescribed number of the memory cells, each having a gate connected to the word line, each having one of a source/drain connected to the conductive line, and each having the other of the source/drain connected to a source line, wherein in a first block and a second block each including a prescribed number of the bit lines arranged therein, positions of the bit lines simultaneously selected in the first and second blocks with reference to ends of the first and second blocks respectively are different from each other.

A memory according to a third aspect comprises a plurality of word lines, a plurality of hit lines arranged so as to intersect with the plurality of word lines, conductive lines provided so as to extend parallel to the word lines, memory cells arranged on intersectional positions between the conductive lines and the bit lines and a plurality of lining wires provided every prescribed number of the memory cells and connecting the word lines and the conductive lines, wherein in a first block and a second block each including a prescribed number of the bit lines arranged therein, positions of the bit lines simultaneously selected at the time of reading data in the first and second blocks with reference to ends of the first and second blocks respectively are different from each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

Figure 1:
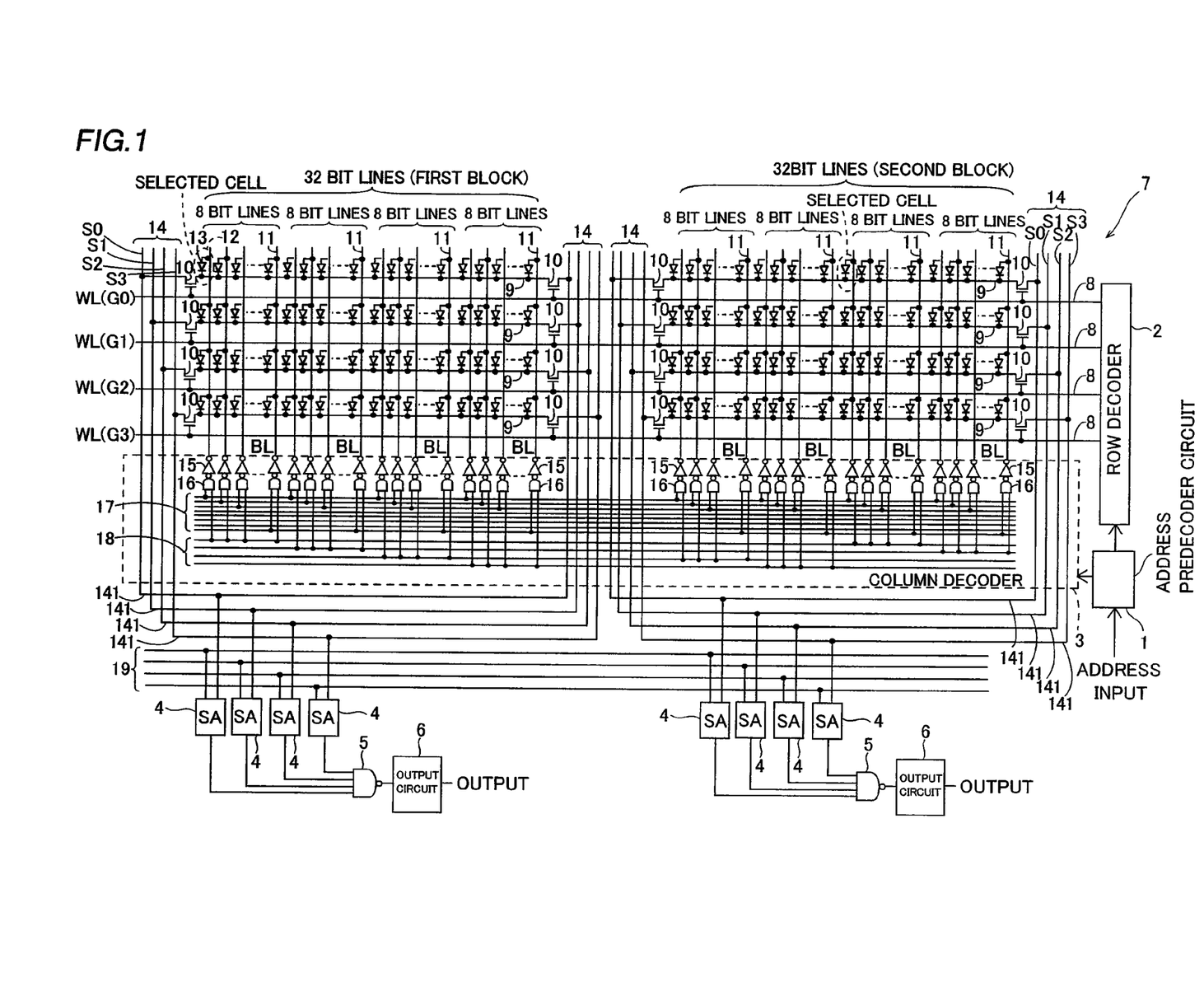
FIG. 1 is a circuit diagram showing a structure of a crosspoint mask ROM according to a first embodiment of the present invention.

A crosspoint mask ROM (diode ROM) according to a first embodiment comprises an address predecoder circuit 1, a row decoder 2, a column decoder 3, sense amplifiers (SA) 4, NAND circuits 5, output circuits 6 and a memory cell array region 7, as shown in FIG. 1. The address predecoder circuit 1 is so formed as to output address data to the row decoder 2 and the column decoder 3 by externally receiving a prescribed address. Word lines (WL) 8 are connected to the row decoder 2. Further, conductive lines 9 extending parallel to the word lines 8 are provided. The row decoder 2 receives the address data from the address predecoder circuit 1. Thus, the row decoder 2 has a function of selecting the word line 8 corresponding to the received address data, bringing the potential of the selected word line 8 to a high level (Vcc) and bringing the potentials of the word lines 8 other than the selected word line 8 to low levels (GND=0V).

Transistors 10 having gates connected to the word lines 8 and sources connected to the conductive lines 9 are provided between the word lines 8 and the conductive lines 9. The transistors 10 are examples of the "first transistors" in the present invention. The transistors 10 are provided every 32 bit lines 11 (32 memory cells 12) described later.

A plurality of the bit lines (BL) 11 arranged so as to intersect with the word lines 8 are connected to the column decoder 3. As shown in FIG. 1, a first block and a second block each including 32 bit lines 11 are provided in the memory cell array region 7.

A plurality of the memory cells 12 are arranged on the memory cell array region 7 in the form of a matrix. The plurality of memory cells 12 are arranged on the intersections between the plurality of conductive lines 9 and the plurality of bit lines 11 arranged to intersect with each other respectively. The memory cells 12 including diodes 13 whose anodes are connected to the bit lines 11 and the memory cells 12 including diodes 13 whose anodes are not connected to the bit lines 11 are provided in the memory cell array region 7.

Source lines 14 are connected to drains of the transistors 10. Each of pairs of the source lines 14 arranged with the 32 bit lines 11 therebetween are connected to a wiring 141. A plurality of the word lines 8 (1024, for example) are arranged in the memory cell array region 7 and classified into a plurality of groups each including a constant number of the word lines 8. According to the first embodiment, the word lines 8 are classified into four groups G0 to G3 each constituted by 256 word lines 8, for example. According to the first embodiment, each four source lines 14 (S0 to S3) are connected to the word lines 8 included in the groups G0 to G3 respectively.

The column decoder 3 is so formed as to receive the address data from the address predecoder circuit 1 to select the bit lines 11 corresponding to the received address data. According to the first embodiment, the output terminals of inverters 15 are connected to ends of the bit lines 11 and output terminals of NAND circuits 16 are connected to input terminals of the inverters 15. The inverters 15 and the NAND circuits 16 are examples of the "logic circuits" in the present invention. The wirings 17 and the wirings 18 are connected to input terminals of the NAND circuits 16. The wirings 17 and the wirings 18 are examples of the "second wirings" and the "first wirings" in the present invention respectively.

The 32 bit lines 11 arranged in each of the first block and the second block are classified into four groups each including the adjacent 8 bit lines and the 8 bit lines are connected to the 8 wirings 17 through the inverters 15 and the NAND circuits 16 respectively. According to the first embodiment, the adjacent 8 bit lines 11 are connected to the wirings 17 so as to be successively selected from a side opposite to a side on which the row decoder 2 is arranged toward the side on which the row decoder 2 is arranged.

According to the first embodiment, the bit lines 11 are classified into the four groups each including the adjacent 8 bit lines 11, and four grouped bit lines 11 are connected to the four wirings 18 respectively. The 8 bit lines 11 arranged on an end of the first block among the groups each including the 8 bit lines 11 in the first block are connected to the 8 bit lines 11 arranged on a side of a center of the second block among the groups each including the 8 bit lines 11 in the second block through the NAND circuits 16 and the inverters 15 by the same wiring 18. According to the first embodiment, the input terminals of the NAND circuits 16 connected to the bit lines 11 arranged on the end of the first block are connected to the input terminals of the NAND circuits 16 connected to the bit lines 11 arranged in the vicinity of the center of the second block by the same wiring 18. The input terminals of the NAND circuits 16 connected to the bit lines 11 arranged in the vicinity of the center of the first block are connected to the input terminals of the NAND circuits 16 connected to the bit lines 11 arranged on an end of the second block by the same wirings 18.

The four source lines 14 (S0 to S3) connected to the conductive lines 9 in each of the first block and the second block are connected to first input terminals of the sense amplifiers 4 respectively. Wirings 19 are connected to second input terminals of the sense amplifiers 4 respectively. Each of the sense amplifiers 4 is so formed as to sense a current flowing in the source line 14 for outputting a high-level signal when the quantity of the current flowing in the selected bit line 11 is in excess of a prescribed level while outputting a low-level signal when the quantity of the current flowing in the selected bit line 11 is less than the prescribed level. The output terminals of the four sense amplifiers 4 are connected to an input terminal of the NAND circuit 5. An output terminal of each NAND circuit 5 is connected to the output circuit 6, and a signal is output when receiving an output from the sense amplifier 4 through the NAND circuit 5.

Operations of the diode ROM according to the first embodiment will be now described with reference to FIG. 1.

First, the address predecoder circuit 1 receives a prescribed address. Thus, the address predecoder circuit 1 outputs address data responsive to the received address to the row decoder 2 and the column decoder 3 respectively. The row decoder 2 decodes the address data, thereby selecting a prescribed word line 8 corresponding thereto. Then, the mask ROM brings the potential of the selected word line 8 to the high level (Vcc), while bringing the potentials of the remaining word lines 8 to the low level (GND). Thus, the transistors 10 having gates connected to the selected word line 8 are turned on, and the conductive lines 9 connected to the selected word line 8 and the source lines 14 are connected to each other. Connection between the conductive lines 9 connected to the selected word line 8 and the source lines 14 are simultaneously performed in both of the first block and the second block.

The column decoder 3 having received the address data from the address predecoder circuit 1, on the other hand, selects prescribed wirings 17 and 18 so as to select prescribed bit lines 11 corresponding to the received address data. Thus, the prescribed wirings 17 and 18 select the prescribed bit lines 11 through the NAND circuits 16 and the inverters 15 connected to the input terminals.

According to the first embodiment, when the group located on the side of the end of the first block is selected, the group located on the side of the center of the second block is simultaneously selected. When the bit line 11 arranged on the end of the first block is selected, the bit line 11 arranged in the vicinity of the center is selected among the bit lines 11 in the second block. More specifically, the bit lines 11 are successively selected from the bit line 11 arranged on the end toward the bit line 11 arranged in the vicinity of the center in the first block, while the bit lines 11 are successively selected from the bit line 11 arranged in the vicinity of the center toward the bit line 11 arranged on the end in the second block. Similarly, when the bit lines 11 are successively selected from the bit line 11 arranged in the vicinity of the center toward the bit line 11 arranged on the end in the first block, the bit lines 11 are successively selected from the bit line 11 arranged on the end toward the bit line 11 arranged in the vicinity of the center in the second block.

The selected bit lines 11 in the first block and the second block are connected to the sense amplifiers 4 through the transistors 10 and the source lines 14. Signals are so input from the wiring 19 that the sense amplifiers 4 are connected to the source lines 14 in which currents from the selected bit lines 11 flow. Then, the sense amplifiers 4 generate potentials close to Vss and supply Vcc to the bit lines 11 selected by the column decoder 3. If the anodes of the diodes 13 of the selected memory cells 12 located on the intersections between the conductive lines 9 provided to extend parallel to the selected word line 8 and the selected bit lines 11 are linked to the bit lines 11, currents flow from the bit lines 11 to the sense amplifiers 4 through the word line 8 and the diodes 13. At this time, the sense amplifiers 4 sense that the quantities of the currents flowing in the bit lines 11 are in excess of the prescribed level, and output low-level signals. The output circuits 6 receiving the output signals from the sense amplifiers 4 through the NAND circuits 5 output high-level signals.

If the anodes of the diodes 13 of the selected memory cells 12 located on the intersections between the selected word line 8 and the selected bit lines 11 are not linked to the bit lines 11, no current flows from the bit lines 11 to the word line 8. In this case, the sense amplifiers 4 sense that no current flows to the word line 8, and output high-level signals. Then the output circuits 6 receiving the output signals from the sense amplifiers 4 through the NAND circuits 5 output low-level signals.

According to the first embodiment, as hereinabove described, the data of the bit line 11 located on the end of the first block is read by the source line 14 in the first block, while the date of the bit line 11 located in the vicinity of the center of the second block is read by the source line 14 in the second block. Thus, the bit line 11 located on the end has the small distance of the conductive line 9 between the memory cell 12 connected to the bit line 11 and the transistor 10 and hence a large current flows, while the bit line 11 located in the vicinity of the center has the large distance of the conductive line 9 between the memory cell 12 and the transistor 10 and hence a small current flows. Thus, the large current and the small current flow from the bit lines 11 simultaneously read to the source lines 14 dissimilarly to the case where data are read from the bit lines 11 located on the ends in both of the first and second blocks to the source lines 14. Therefore, the quantities of the currents flowing in the source lines 14 can be reduced as compared with the case where large currents flow from the bit lines 11 simultaneously read to the source lines 14 respectively. Consequently, increase in current consumption (power consumption) can be suppressed.

According to the first embodiment, as hereinabove described, the first input terminals of the NAND circuits 16 connected to the bit lines 11 on the side of the end through the inverters 15 among the 32 bit lines 11 in the first block are connected to the first input terminals of the NAND circuits 16 connected to the bit lines 11 on the side of the vicinity of the center of the second block through the inverters 15 among the 32 bit lines 11 in the second block by the same wiring 18. Thus, the data of the bit line 11 located on the end of the first block can be easily read by the source line 14 and the data of the bit line 11 located in the vicinity of the center of the second block can be easily read by the source line 14.

According to the first embodiment, as hereinabove described, the 32 bit lines 11 in each of the first block and the second block are classified into the four groups each including the adjacent 8 bit lines. The group located on the side of the end among the four groups of the first block and the group located on the side of the center among the four groups of the second block are connected to each other by the same wiring 18. Thus, the group located on the side of the end among the groups of the bit lines 11 in the first block and the group located on the side of the center among the groups of the bit lines 11 in the second block can be easily simultaneously selected.

According to the first embodiment, the input terminals of the NAND circuits 16 are so connected to the wirings 17 and the wirings 18 that the bit lines 11 are selected from a side opposite to a side on which the row decoder 2 is arranged toward the side on which the row decoders 2 is arranged. Thus, the group located on the side of the end among the groups of the bit lines 11 in the first block and the group located on the side of the center among the groups of the bit lines 11 in the second block are simultaneously selected. In this case, the bit lines 11 can be successively selected from the end toward the vicinity of the center in the first block, while the bit lines 11 can be successively selected from the vicinity of the center toward the end in the second block.

According to the first embodiment, as hereinabove described, the inverters 15 having the output terminals connected to the bit lines 11 and the NAND circuits 16 having the output terminals connected to the input terminals of the inverters 15 constitute logic circuits. Thus, the bit lines 11 connected to the NAND circuits 16 through the inverters 15 can be easily selected by inputting high level signals from the wirings 17 and the wirings 18 to the NAND circuits 16 respectively.

Second Embodiment

Figure 2:
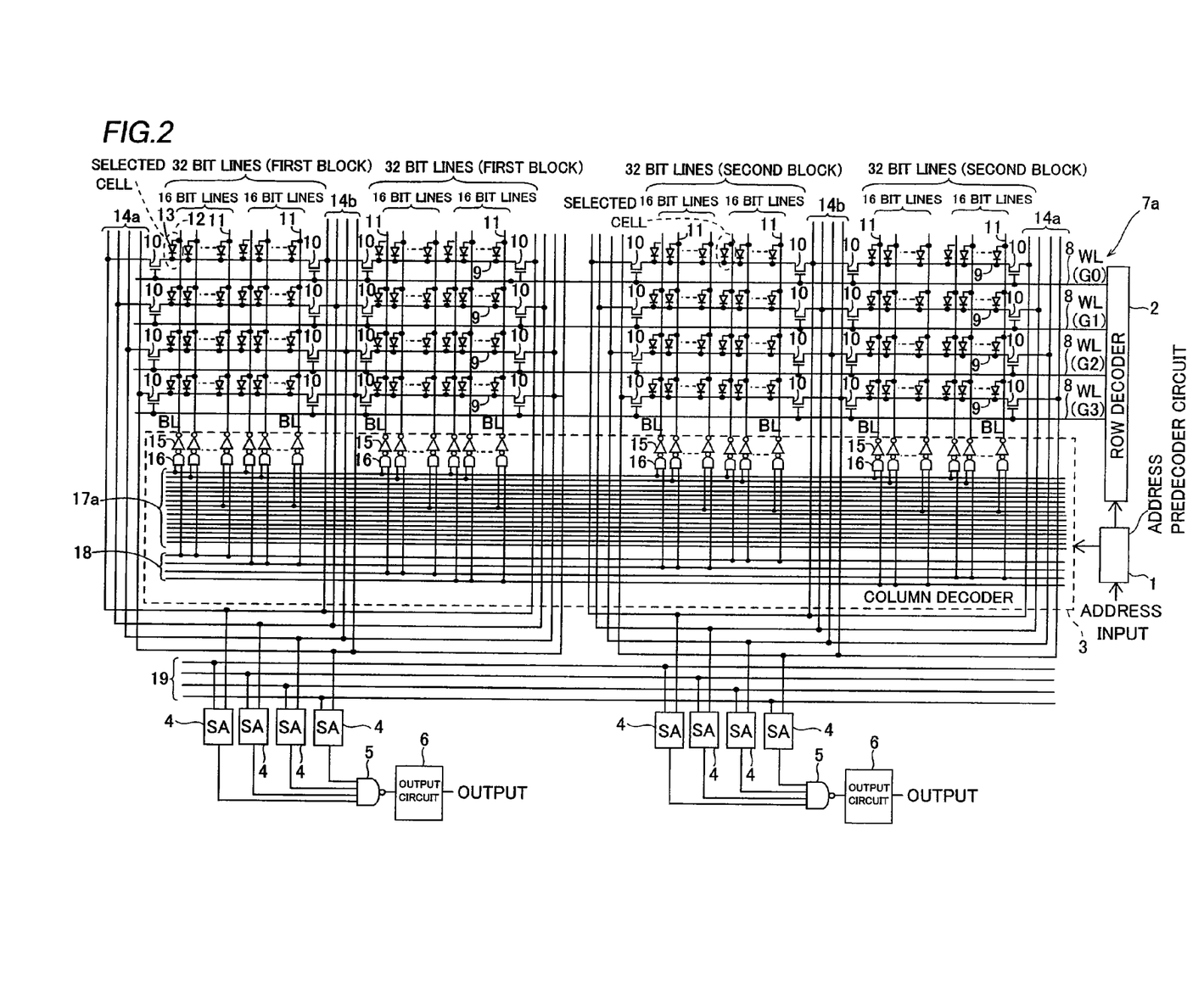
FIG. 2 is a circuit diagram showing a structure of a crosspoint mask ROM according to a second embodiment of the present invention.

In a diode ROM according to a second embodiment, one output circuit 6 outputs a signal from 64 bit lines 11 dissimilarly to the aforementioned first embodiment.

As shown in Fig, 2, in the diode ROM according to the second embodiment, transistors 10 having gates connected to word lines 8 and sources connected to conductive lines 9 are provided between the word lines 8 and the conductive lines 9. The transistors 10 are provided every 32 bit lines 11 (32 memory cells 12). Two first blocks each including 32 bit lines 11 and two second blocks each including 32 bit lines 11 are provided in a memory cell array region 7a. The two first blocks (second blocks) are connected to each other through the transistors 10. Source lines 14a are connected to ends of the two first blocks (second blocks) through the transistors 10. Source lines 14b provided between the two first blocks (second blocks) are connected to drains of the transistors 10. The source lines 14a and the source lines 14b are connected to each other. First input terminals of the sense amplifiers 4 are connected to the source lines 14a, and one output signal is output from the 64 bit lines 11 included in the two first blocks (second blocks).

According to the second embodiment, the 32 bit lines 11 in each of the first block and the second block are classified into two groups each including the adjacent 16 bit lines 11. The bit lines 11 included in the group where the bit lines 11 are selected from a side of the end of the first block toward a side of the center, among the two groups including the bit lines 11 in the first blocks, and the bit lines 11 included in the group where the bit lines 11 are selected from a side of the center of the second block toward a side of the end are connected to each other by wirings 18 through inverters 15 and NAND circuits 16.

Wirings 17a are connected to first input terminals of the NAND circuits 16. The wirings 17a are connected to the bit lines 11 through the inverters 15 and the NAND circuits 16 respectively. The grouped bit lines 11 are connected to the wirings 17a so as to be selected from the first end of each group including the bit lines 11 toward the second end.

The remaining structure of the diode ROM according to the second embodiment is similar to that of the diode ROM according to the aforementioned first embodiment.

Operations of the diode ROM according to the second embodiment are similar to those of the diode ROM according to the aforementioned first embodiment.

According to the second embodiment, as hereinabove described, the 32 bit lines 11 in each of the first block and the second block are classified into two groups each including the adjacent 16 bit lines 11. The group where the bit lines 11 are selected from the side of the end of the first block toward the side of the center among the two groups including the bit lines 11 in the first blocks and the group where the bit lines 11 are selected from the side of the center of the second block toward the side of the end are connected to each other by the wirings 18. Thus, the bit line 11 located on the end of the first block, in which a large current flows, and the bit line 11 located in the vicinity of the center of the second block, in which a small current flows, can be simultaneously selected. Therefore, the quantities of the currents flowing in the source lines 14 can be reduced as compared with the case where large currents flow from the bit lines 11 simultaneously read to the source lines 14 respectively. Consequently, increase in current consumption (power consumption) can be suppressed.

The remaining effects of the second embodiment are similar to those of the aforementioned first embodiment.

Third Embodiment

Figure 3:
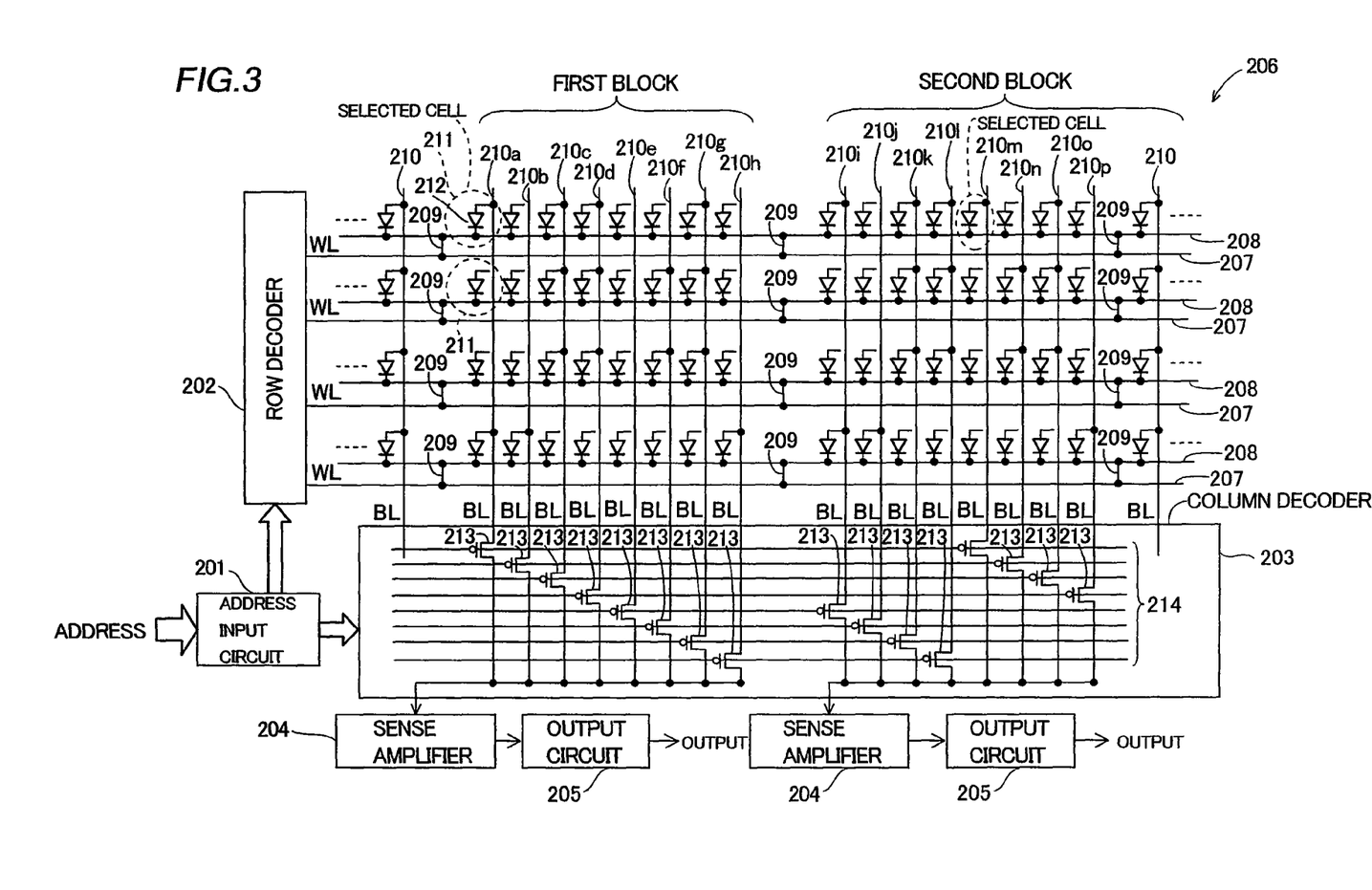
FIG. 3 is a circuit diagram showing a structure of a crosspoint mask ROM according to a third embodiment of the present invention.

A diode ROM according to a third embodiment comprises an address input circuit 201, a row decoder 202, a column decoder 203, sense amplifiers 204, output circuits 205, and a memory cell array region 206, as shown in FIG. 3. The address input circuit 201 is so formed as to output address data to the row decoder 202 and the column decoder 203 by externally receiving a prescribed address. Word lines (WL) 207 are connected to the row decoder 202. Further, conductive lines 208 extending parallel to the word lines 207 are provided. The word lines 207 and the conductive lines 208 are connected to each other by lining wires 209 provided every 8 memory cells 211 described later. The row decoder 202 has a function of receiving the address data from the address input circuit 201 to select the word line 207 corresponding to the received address data, bringing the potential of the selected word line 207 to a low level (GND=0V) and bringing the potentials of the word lines 207 other than the selected word line 207 to high levels (Vcc).

A plurality of bit lines (BL) 201 arranged so as to intersect with the word lines 207 are connected to the column decoder 203. The 8 bit lines 210 (210a to 210h, 210i to 210p) are held between the adjacent lining wires 209. A region where a plurality of the bit lines 210a to 210h held between the lining wires 209 are arranged is a first block and a region where a plurality of the bit lines 210i to 210p held between the lining wires 209 are arranged is a second block.

A plurality of the memory cells 211 are arranged on the memory cell array region 206 in the form of a matrix. The plurality of memory cells 211 are arranged on the intersections between the plurality of conductive lines 208 and the plurality of bit lines 210 arranged to intersect with each other respectively. The memory cells 211 including diodes 212 whose anodes are connected to the bit lines 210 and the memory cells 211 including diodes 212 whose anodes are not connected to the bit lines 210 are provided in the memory cell array region 206.

The column decoder 203 are so formed that the selected bit lines 210 and the sense amplifiers 204 are connected to each other through p-type transistors 213. A gate of each transistor 213 is connected to a wiring 214. The transistors 213 are examples of the "second transistors" in the present invention. The wirings 214 are examples of the "third wirings" in the present invention. The column decoder 203 receives address data from the address input circuit 201 to select the bit lines 210 corresponding to the received address data. According to the third embodiment, the gate of the transistor 213 connected to the bit line 210a included in the first block and the gate of the transistor 213 connected to the bit line 210m included in the second block are connected to the same wiring 214. The bit line 210a is arranged on an end in the first block, while the bit line 210m is arranged in the vicinity of a center in the second block.

Each of the sense amplifiers 204 senses a current flowing in the bit line 210 selected by the column decoder 203 for outputting a high-level signal when the quantity of the current flowing in the selected bit line 210 is in excess of a prescribed level while outputting a low-level signal when the quantity of the current flowing in the selected bit line 210 is less than the prescribed level. Each of the output circuits 205 is so formed as to output a signal by receiving the output from the sense amplifier 204.

Operations of the diode ROM according to the third embodiment will be now described with reference to FIG. 3.

First, the address input circuit 201 receives a prescribed address. Thus, the address input circuit 201 outputs address data responsive to the received address to the row decoder 202 and the column decoder 203 respectively. The row decoder 202 decodes the address data, thereby selecting a prescribed word line 207 corresponding thereto. Then, the diode ROM brings the potential of the selected word line 207 to the low level (GND), while bringing the potentials of the remaining word lines 207 to the high level (Vcc).

The column decoder 203 having received the address data from the address input circuit 201, on the other hand, selects prescribed bit lines 210 corresponding to the received address data and the selected bit lines 210 are connected to the sense amplifiers 204. Then, the sense amplifiers 204 supply potentials close to Vcc to the selected bit lines 210. If the anodes of the diodes 212 of the selected memory cells 211 located on the intersections between the conductive lines 208 provided to extend parallel to the selected word line 207 and the selected bit lines 210 are linked to the bit lines 210, currents flow from the sense amplifiers 204 to the word lines 207 through the bit lines 210 and the diodes 212. At this time, the sense amplifiers 204 sense that the quantities of the currents flowing in the bit lines 210 arc in excess of the prescribed level, and output high-level signals. The output circuits 205 receiving the output signals from the sense amplifiers 204 output high-level signals.

If the anodes of the diodes 212 of the selected memory cells 211 located on the intersections between the selected word line 207 and the selected bit lines 210 are not linked to the bit lines 210, no current flows from the bit lines 210 to the word line 207. In this case, the sense amplifiers 204 sense that no current flows to the word line 207, and output low-level signals. Then the output circuits 205 receiving the output signals from the sense amplifiers 204 output low-level signals.

At this time, the wiring 214 receives the signal to turn on the transistors 213, thereby selecting the bit lines 210 included in the first block and the second block one by one. The bit lines 210 included in the first block are successively selected from the bit line 210a located on a first end of the first block to the bit line 210h located on a second end. According to the third embodiment, when the bit line 210a located on the first end of the first block is selected, the bit line 210m located in the vicinity of the center of the second block is selected in the second block. Thereafter the bit lines 210n to 210p are successively selected. When the bit line 210e located in the vicinity of a center of the first block is selected, the bit line 210i located on a first end of the second block is selected. Thereafter the bit lines 210j to 210l are successively selected toward the center of the second block. Thus, when the bit line 210 located on a side of the end of the first block is selected, the bit line 210 located on a side of the center is selected in the second block, according to the third embodiment. When the bit line 210 located on the side of the center of the first block is selected, the bit line 210 located on the side of the end is selected in the second block.

According to the third embodiment, as hereinabove described, data of the bit line 210 located on the side of the end of the first block and data of the bit line 210 on the side of the center of the second block are simultaneously read, whereby the bit line 210 located on the side of the end, in which the large quantity of current flows, and the bit line 210 on the side of the center, in which the small quantity of current flows, can be simultaneously read. Thus, the large current and the small current flow in the bit lines 210 simultaneously read dissimilarly to the case where data are read from the bit lines 210 located on the ends in both of the first and second blocks, and hence the quantities of the currents flowing in the bit lines can be reduced as compared with the case where the large currents flow in both of the bit lines. Consequently, increase in current consumption (power consumption) can be suppressed.

According to the third embodiment, as hereinabove described, data of the bit line 210a located on the end of the first block and data of the bit line 210m located in the vicinity of the center of the second block are simultaneously read. Thus, the quantities of the currents flowing in the bit lines can be easily reduced as compared with the case where large currents flow in both of the bit lines 210 simultaneously read, dissimilarly to the case where data are read from the bit lines 210 located on the ends of both of the first and second blocks.

According to the third embodiment, as hereinabove described, the wirings 214 are so formed that the transistor 213 arranged on the side of the end, among the transistors 213 connected to the plurality of bit lines 210 in the first block held between the lining wires 209, is turned on while the transistor 213 located in the vicinity of the center, among the transistors 213 connected to the plurality of bit lines 210 in the second block held between the lining wires 209, is turned on when the bit lines 210 in the first and second blocks are simultaneously read at the time of reading data. Thus, the bit line 210a in which the large quantity of current flows and the bit line 210m in which the small quantity of current flows are simultaneously read, and hence the quantities of the currents flowing in the bit lines can be easily reduced as compared with the case where large currents flow in both of the bit lines 210 simultaneously read, dissimilarly to the case where data are read from the bit lines 210 located on the ends of both of the first and second blocks.

Fourth Embodiment

Figure 4:
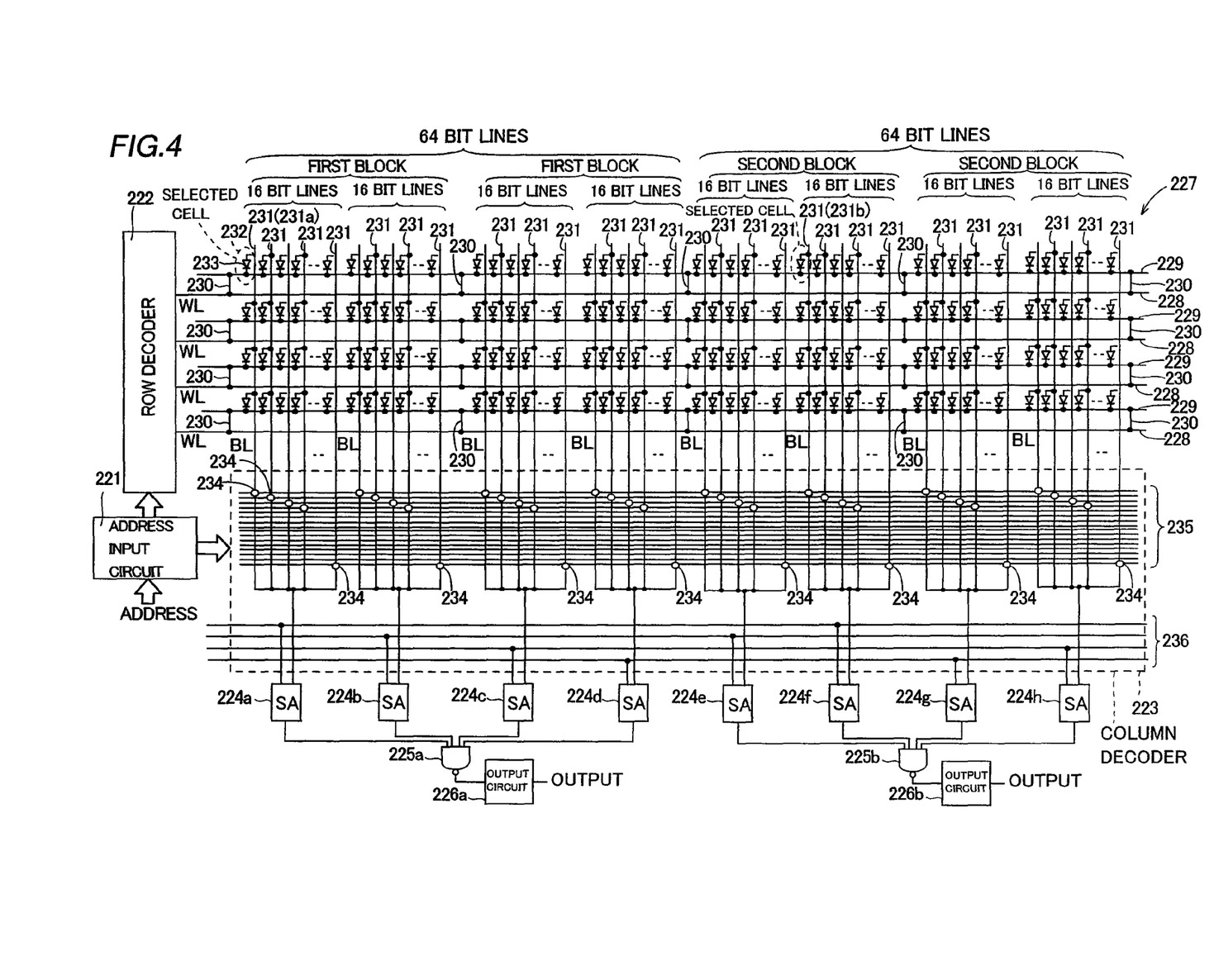
FIG. 4 is a plane layout diagram showing a structure of a crosspoint mask ROM according to a fourth embodiment of the present invention.

In a diode ROM according to a fourth embodiment, 32 bit lines 231 are held between lining wires 230 dissimilarly to the aforementioned third embodiment.

As shown in FIG. 4, the diode ROM according to the fourth embodiment comprises an address input circuit 221, a row decoder 222, a column decoder 223, sense amplifiers (SA) 224a to 224h, NAND circuits 225a and 225b, output circuits 226a and 226b and a memory cell array region 227. The sense amplifiers 224a, 224c, 224e and 224g are examples of the "first sense amplifiers" in the present invention and the sense amplifiers 224b, 224d, 224f and 224h are examples of the "second sense amplifiers" in the present invention. The address input circuit 221 is so formed as to output address data to the row decoder 222 and the column decoder 223 by externally receiving a prescribed address. Word lines 228 are connected to the row decoder 222. Further, conductive lines 229 extending parallel to the word lines 228 are provided. The word lines 228 and the conductive lines 229 are connected to each other by lining wires 230 provided every 16 memory cells 232 described later. The row decoder 222 has a function of receiving the address data from the address input circuit 221 to select the word line 228 corresponding to the received address data, bringing the potential of the selected word line 228 to a low level (GND=0V) and bringing the potentials of the word lines 228 other than the selected word line 228 to high levels (Vcc).

A plurality of bit lines 231 arranged so as to intersect with the word lines 228 are connected to the column decoder 223. The bit lines 231 are so formed that the 32 bit lines 231 are held between the adjacent lining wires 230.

A plurality of the memory cells 232 are arranged on the memory cell array region 227 in the form of a matrix. The plurality of memory cells 232 are arranged on the intersections between the conductive lines 229 arranged to extend parallel to the plurality of word lines 228 and the plurality of bit lines 231, which are arranged to intersect with each other respectively. The memory cells 232 including diodes 233 whose anodes are connected to the bit lines 231 and the memory cells 232 including diodes 233 whose anodes are not connected to the bit lines 231 are provided in the memory cell array region 227.

Figure 5:
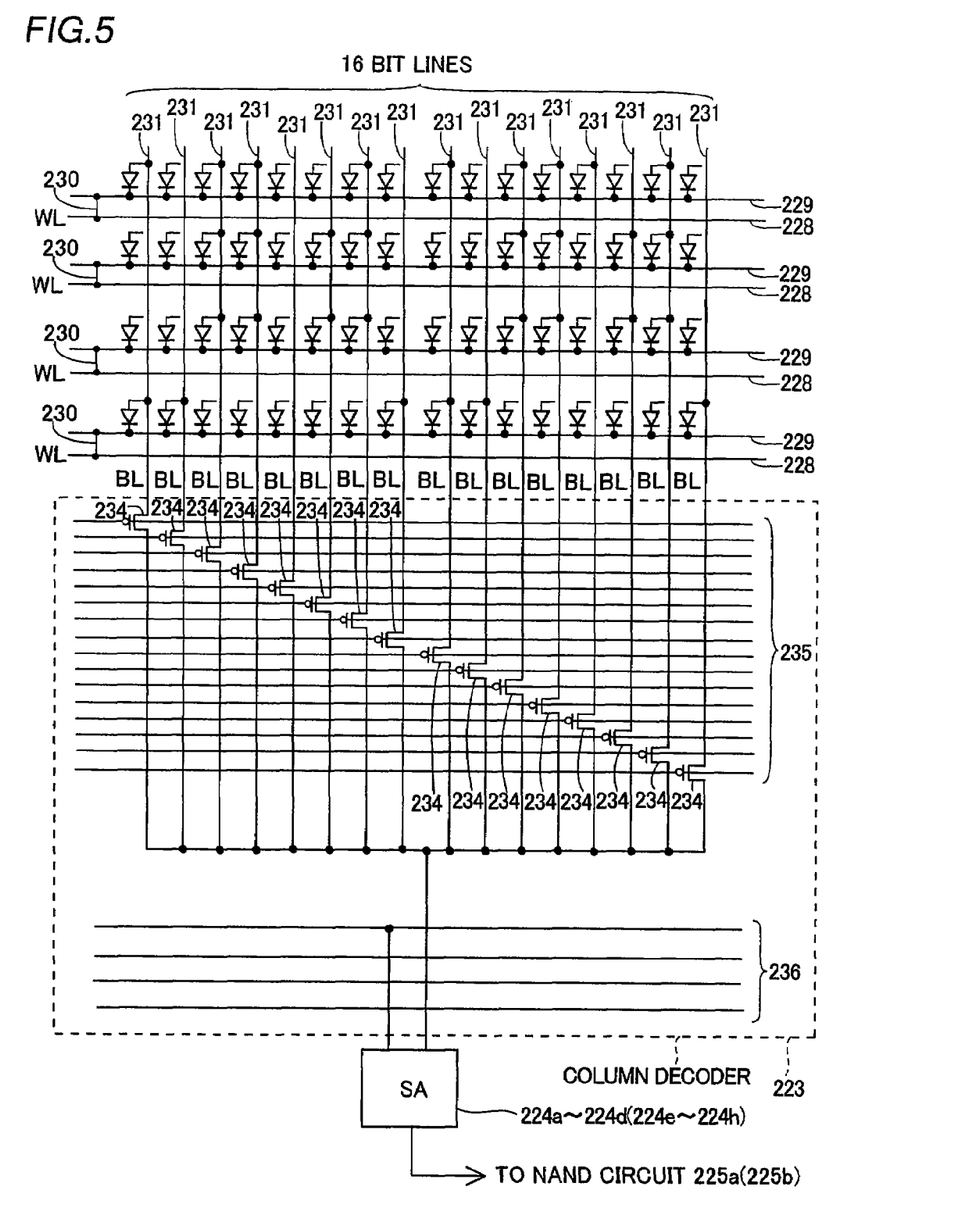
FIG. 5 is an enlarged view of the structure of the crosspoint mask ROM according to the fourth embodiment of the present invention.

As shown in FIG. 5, the column decoder 223 receives address data from the address input circuit 221 (see FIG. 4) to select the bit line 231 corresponding to the received address data, and connected to the selected bit line 231 and one of the sense amplifiers 224a to 224d (sense amplifiers 224e to 224h) through a p-type transistor 234. Wirings 235 are connected to gates of the respective transistors 234 respectively. The plurality of bit lines 231 are so formed that the adjacent 16 bit lines 231 are successively selected from the bit line 231 located on a first end to the bit line 231 located on a second end.

As shown in FIG. 4, the 16 bit lines in the 32 bit lines 231 held between the lining wires 230 are connected to each of the sense amplifiers 224a to 224h. The sense amplifiers 224a to 224d are connected to the NAND circuit 225a and the NAND circuit 225a is connected to the output circuit 226a. The sense amplifiers 224e to 224h are connected to the NAND circuit 225b and the NAND circuit 225a is connected to the output circuit 226b. Thus, the diode ROM is so formed as to obtain an output from the 64 bit lines 231 connected to the sense amplifiers 224a to 224d (sense amplifiers 224e to 224h). A region where the bit lines 231 connected to the sense amplifiers 224a (224c) and 224b (224d) are arranged is a first block and a region where the bit lines 231 connected to the sense amplifiers 224e (224g) and 224f (224h) are arranged is a second block.

The sense amplifier 224a (224c) is connected to the plurality of bit lines 231, data of which are read from an end of the first block toward the vicinity of a center thereof, among the bit lines 231 in the first block, while the sense amplifier 224b (224d) is connected to the plurality of bit lines 231, data of which are read from the vicinity of the center of the first block toward the end thereof. The sense amplifier 224e (224g) is connected to the plurality of bit lines 231, data of which are read from an end of the second block toward the vicinity of a center thereof, among the bit lines 231 in the second block, while the sense amplifier 224f (224h) is connected to the plurality of bit lines 231, data of which are read from the vicinity of the center of the second block toward the end thereof.

First ends of the sense amplifiers 224a to 224h are connected to the bit lines 231 and wirings 236. The wirings 236 are examples of the "fourth wirings" in the present invention. The sense amplifier 224a (224b) and the sense amplifier 224f (224e) are connected to each other by the same wiring 236, thereby simultaneously selecting the sense amplifier 224a (224b) and the sense amplifier 224f (224e). The sense amplifier 224c (224d) and the sense amplifier 224h (224g) are connected to each other by the same wiring 236, thereby simultaneously selecting the sense amplifier 224c (224d) and the sense amplifier 224h (224g).

According to the fourth embodiment, the diode ROM is so formed that the sense amplifier 224a (224c) connected to the bit lines 231, data of which are read from the end of the first block toward the center thereof, among the sense amplifiers 224a to 224d connected to the output circuit 226a, and the sense amplifier 224f (224h) connected to the bit lines 231, data of which are read from the vicinity of the center of the second block toward the end thereof, among the sense amplifiers 224e to 224h connected to the output circuit 226b, are simultaneously selected. According to the fourth embodiment, the diode ROM is so formed that the sense amplifier 224b (224d) connected to the bit lines 231, data of which are read from the vicinity of the center of the first block toward the end thereof, among the sense amplifiers 224a to 224d connected to the output circuit 226a, and the sense amplifier 224e (224g) connected to the bit lines 231, data of which are read from the end of the second block toward the center thereof, among the sense amplifiers 224e to 224h connected to the output circuit 226b, are simultaneously selected.

Operations of the diode ROM according to the fourth embodiment will be now described with reference to FIGS. 4 and 5.

First, the address input circuit 221 receives a prescribed address. Thus, the address input circuit 221 outputs address data responsive to the received address to the row decoder 222 and the column decoder 223 respectively. The row decoder 222 decodes the address data, thereby selecting a prescribed word line 228 corresponding thereto. Then, the diode ROM brings the potential of the selected word line 228 to the low level (GND), while bringing the potentials of the remaining word lines 228 to the high levels (Vcc).

The column decoder 223 having received the address data from the address input circuit 221, on the other hand, selects a prescribed bit line 231 corresponding to the received address data by turning on the transistor 234 having a gate connected to the wiring 235 and the selected bit line 231 is connected to one of the sense amplifiers 224a to 224h connected to the selected bit line. In this embodiment, it is assumed that a bit line 231a in the first block connected to the sense amplifier 224a is selected. Then, the sense amplifier 224a supplies a potential close to Vcc to the selected bit line 231a. If the anode of the diode 233 of the selected memory cell 232 located on the intersection between the selected word line 228 and the selected bit line 231a is linked to the bit line 231a by receiving a signal from the wiring 236 connected to the sense amplifier 224a, a current flows from the sense amplifier 224 to the word line 228 through the bit line 231a and the diode 233. At this time, the sense amplifier 224a senses that the quantity of the current flowing in the bit line 231a is in excess of the prescribed level, and outputs a high-level signal. The output circuit 226a receiving the output signal from the sense amplifier 224a through the NAND circuit 225a outputs a high-level signal.

A bit line 231b connected to the same wiring 235 to which the bit line 231a is connected is selected simultaneously with the bit line 231a, and the sense amplifier 224f connected to the same wiring 236 to which the sense amplifier 224a is connected is selected simultaneously with the sense amplifier 224a. Consequently, if the anode of the diode 233 of the selected memory cell 232 located on the intersection between the selected word line 228 and the selected bit line 231b is linked to the bit line 231b, a current flows from the sense amplifier 224 to the word line 228 through the bit line 231b and the diode 233. At this time, the sense amplifier 224f senses that the quantity of the current flowing in the bit line 231b is in excess of the prescribed level, and outputs a high-level signal. The output circuit 226b receiving the output signal from the sense amplifier 224f through the NAND circuit 225b outputs a high-level signal.

If the anode of the diode 233 of the selected memory cell 232 located on the intersection between the selected word line 228 and the selected bit line 231a (231b) is not linked to the bit line 231a (231b), no current flows from the bit line 231a (231b) to the word line 228. In this case, the sense amplifier 224a (224f) senses that no current flows to the word line 228, and outputs a low-level signal. Then the output circuit 226a (225b) receiving the output signal from the sense amplifier 224a (224f) through the NAND circuit 225a (225b) outputs a low-level signal.

According to the fourth embodiment, as hereinabove described, the diode ROM is so formed as to include the sense amplifier 224a (224c) connected to the plurality of bit lines 231, data of which are read from the end toward the vicinity of the center, among the bit lines 231 in the first block, and the sense amplifier 224f (224h) connected to the plurality of bit lines 231, data of which are read from the vicinity of the center toward the end, among the bit lines 231 in the second block. Thus, the sense amplifier 224a (224c) and the sense amplifier 224f (224h) are simultaneously selected and hence the bit line 231 on the end of the first block, in which the large quantity of current flows, and the bit line 231 in the vicinity of the center of the second block, in which the small quantity of current flows can be simultaneously read. Therefore, the quantities of the currents flowing in the bit lines can be reduced as compared with the case where the large currents flow in the plurality of bit lines 231 simultaneously read, dissimilarly to the case where data are read from the bit lines located on the ends in both of the first and second blocks. Thus, increase in current consumption (power consumption) can be suppressed. Similarly, the diode ROM is so formed as to include the sense amplifier 224b (224d) connected to the plurality of bit lines 231, data of which are read from the vicinity of the center toward the end, among the bit lines 231 in the first block, and the sense amplifier 224e (224g) connected to the plurality of bit lines 231, data of which are read from the end toward the vicinity of the center, among the bit lines 231 in the second block. Thus, the sense amplifier 224*b* (224*d*) and the sense amplifier 224*e* (224*g*) are simultaneously selected and hence the bit line 231 in the vicinity of the center of the first block, in which the small quantity of current flows, and the bit line 231 on the end of the second block, in which the large quantity of current flows can be simultaneously read. Therefore, the quantities of the currents flowing in the bit lines can be reduced as compared with the case where the large currents flow in the plurality of bit lines 231 simultaneously read, dissimilarly to the case where data are read from the bit lines located on the ends in both of the first and second blocks. The non-selected sense amplifiers among the sense amplifiers 224*a* to 224*h* are so controlled as to be brought into a state of being separated from the bit lines 231.

According to the fourth embodiment, as hereinabove described, the diode ROM comprises the wirings 236 provided between the sense amplifiers 224*a* to 224*h* and the bit lines 231. The wirings 236 connect the sense amplifiers 224*a*, 224*b*, 224*c* and 224*d* to the sense amplifiers 224*f*, 224*e*, 224*h* and 224*g* respectively. Thus, the sense amplifier connected to the bit line 231 on the end of the first block (second block) and the sense amplifier connected to the bit line 231 in the vicinity of the center of the second block (first block) can be easily simultaneously selected.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first to fourth embodiments of the present invention is applied to the crosspoint mask ROM, the present invention is not restricted to this but also applicable to a memory comprising memory cells including diodes other than the crosspoint mask ROM.

While the transistors are arranged every 32 bit lines in each of the aforementioned first and second embodiments, the present invention is not restricted to this but the transistors may be arranged every bit lines of a number other than 32.

While the logic circuits connected to the bit lines are constituted by the inverter circuits and the NAND circuits in each of the aforementioned first and second embodiments, the present invention is not restricted to this but the logic circuits may be constituted by circuits other than the inverter circuits and the NAND circuits.

While the sources of the transistors are connected to the conductive lines and the drains of the transistors are connected to the source lines in each of the aforementioned first and second embodiments, the present invention is not restricted to this but the drains of the transistors may be connected to the conductive lines and the sources of the transistors may be connected to the source lines.

While the bit lines in the first block are successively selected from the side of the end toward the side of the center while the bit lines in the second block are successively selected from the side of the center toward the side of the end in each of the aforementioned first and second embodiments, the present invention is not restricted to this but the bit lines in the first block may be selected successively from the second bit line, the first bit line, the third bit line, the fourth bit line, the sixth bit line, the fifth bit line, the seventh bit line, the eighth bit line . . . in this order, from the side of the end toward the side of the center, while the bit lines in the second block may be selected successively from the second bit line, the first bit line, the third bit line, the fourth bit line, the sixth bit line, the fifth bit line, the seventh bit line, the eighth bit line . . . in this order, from the side of the center toward the side of the end. In other words, the bit lines in the first block may be selected substantially from the side of the end toward the side of the center while the bit lines in the second block may be selected substantially from the side of the center toward the side of the end.

While the lining wires are arranged every 8 and 32 bit lines in the aforementioned third and fourth embodiments respectively, the present invention is not restricted to this but the lining wires may be arranged every bit lines of a number other than 8 and 32.

While the bit lines in the first block are successively selected from the side of the end toward the side of the center while the bit lines in the second block are successively selected from the side of the center toward the side of the end in each of the aforementioned third and fourth embodiments, the present invention is not restricted to this but the bit lines 210 in the first block shown in FIG. 3 may be selected successively from the bit lines 210*b*, 210*a*, 210*c*, 210*d*, 210*f*, 210*e*, 210*g* and 210*h* while the bit lines 210 in the second block may be selected successively from the bit lines 210*n*, 210*m*, 210*o*, 210*p*, 210*j*, 210*i*, 210*k* and 210*l*. In other words, the bit lines 210 in the first block may be selected substantially from the side of the end toward the side of the center while the bit lines 210 in the second block may be selected substantially from the side of the center toward the side of the end.

What is claimed is:

1. A memory comprising:
   first and second memory blocks including memory cells arranged in matrix, the first block including bit lines aligned parallel to each other between boundaries of the first block, the boundaries of the first block being parallel with the bit lanes of the first block, the second block including bit lines aligned parallel to each other between boundaries of the second block, the boundaries of the second block being parallel with the bit lines of the second block;
   word lines intersecting with the bit lines in the first and second blocks, respectively; and
   conductive lines provided so as to extend parallel to the word lines, the memory cells being arranged on intersectional positions between the conductive lines and bit lines in the first and second blocks, each memory cell comprising a diode having an anode connected to a corresponding bit line and a cathode connected to a corresponding conductive line, wherein
   a bit line in the first block and a bit line in the second block are simultaneously selected, and
   the selected bit line in the first block is one close to one of the boundaries of the first block and the selected bit line in the second block is one distant from the boundaries of the second block, and vice versa.

2. The memory according to claim 1, further comprising a plurality of first transistors each having gate, source, and drain terminals, the gate terminal being connected to one of the word lines, one of the source and drain terminals being connected to one of the conductive lines, and the other of the source and drain terminals being connected to a source line.

3. The memory according to claim 1, wherein when the selected bit line in the first block is one of two outermost bit lines between the boundaries of the first block, and the selected bit line in the second block is the centermost bit line between the boundaries of the second block.

4. The memory according to claim 1 further comprising:
   logic circuits having output terminals connected to the bit lines in the first and second blocks, respectively; and first connecting lines connected to first input terminals of the logic circuits, respectively, wherein the selected bit line in the first block is coupled to one logic circuit, and the selected bit line in the second block is coupled to another logic circuit, the one logic circuit being coupled to the another logic circuit through one of the first connecting lines so that the selected bit line in the first block and the selected second bit line in the second block are simultaneously selected.

5. The memory according to claim 4, wherein the bit lines in the first block is grouped into a plurality of groups each including bit lines adjacent to each other, the bit lines in the second block is grouped into a plurality of groups each including bit lines adjacent to each other, and bit lines in a group of the first block located close to one of the boundaries and bit lines in a group of the second block located close to the center between the boundaries are connected to each other through one of the first connecting lines.

6. The memory according to claim 5, further comprising second connecting lines connected to second input terminals of the logic circuits, respectively, wherein bit lines in each group are coupled to the second connecting lines, respectively, and are successively selected from one of two outermost bit lines in each group to the other outermost bit line.

7. The memory according to claim 4, wherein the bit lines in the first and second blocks are aligned parallel to each other and arranged in a direction in which the word lines extends, the bit lines in the first and second blocks are grouped into a plurality of groups each including bit lines adjacent to each other, and the first block includes a first group having bit lines arranged in the direction from one of the boundaries to a center between the boundaries of the first block, the second block area includes a second group having bit lines arranged in the direction from a center between the boundaries to one of the boundaries of the second block, and bit lines in the first group of the first block are connected to bit lines in the second group of the second block through one of the first connecting lines.

8. The memory according to claim 4, wherein the logic circuits are constituted by inverters having output terminals connected to the bit lines and NAND circuits having output terminals connected to input terminals of the inverters.

9. The memory according to claim 1, further comprising a plurality of lining lines, at least one lining line being provided between one word line and corresponding one conductive line in each of the first and second blocks.

10. The memory according to claim 9, wherein when the selected bit line in the first block is one of two outermost bit lines between the boundaries of the first block, the selected bit line in the second block is the centermost bit line between the boundaries of the second block.

11. The memory according to claim 9, further comprising:

sense amplifiers connected to the bit lines of the first block and the bit lines of the second block, respectively;

transistors coupled between the bit lines of the first block and a corresponding sense amplifier and between the bit lines of the second block and another corresponding sense amplifier, respectively; and connecting lines connected to gates of the transistors, respectively, wherein one of the connecting lines is coupled to two of the transistors which are respectively select a bit line in the first block close to one of the boundaries of the first block area and a bit line in the second block distant from the boundaries of the second block.

12. The memory according to claim 9, further comprising an additional first block in addition to the first block and an additional second block in addition to the second block, the additional first and additional second blocks each including memory cells arranged in matrix. the additional first block including bit lines aligned parallel to each other between boundaries of the first block, the additional second block including bit lines aligned parallel to each other between boundaries of the second block;

the word lines intersecting with the bit lines in the additional first and second blocks, respectively;

the conductive lines provided so as to extend parallel to the word lines, the memory cells being arranged on intersectional positions between the conductive lines and the bit lines in the additional first and second blocks, wherein a bit line in the additional first block and a bit line in the additional second block are simultaneously selected, and the selected bit line in the additional first block is one close to one of the boundaries of the additional first block and the selected bit line in the additional second block is one distant from the boundaries of the additional second block, and vice versa.

13. The memory according to claim 12, wherein bit lines in the first, additional first, second, and additional second blocks are aligned parallel to each other and arranged in a direction in which the word lines extends, and the memory further comprises first sense amplifiers connected to bit lines included in the first block and the additional first block, respectively, and second sense amplifiers connected to bit lines included in the second block and the additional block, respectively, one first sense amplifier is connected to bit lines arranged in the direction from one of the boundaries to a center between the boundaries of the first or additional first block, and one second sense amplifier is connected to bit lines arranged in the direction from a center between the boundaries to one of the boundaries of the second or additional second block, and the one first sense amplifier and the one second sense amplifier are simultaneously selected.

14. The memory according to claim 13, further comprising a connection line provided to select the one first sense amplifier and the one second sense amplifier simultaneously.

15. The memory according to claim 12, wherein bit lines in the first, additional first, second, and additional second blocks are aligned parallel to each other and arranged in a direction in which the word lines extends, and the memory further comprises:

a first output circuit outputting data from bit lines of the first and additional first blocks;

a second output circuit outputting data output from bit lines of the second and additional second blocks; and first sense amplifiers each having a first end connected to corresponding bit lines in one of the first and additional first blocks and a second end connected to the first output circuit;

second sense amplifiers each having a first end connected to corresponding bit lines in one of the second and additional second blocks and a second end connected to the second output circuit, wherein one of the first sense amplifiers is connected to bit lines arranged in the direction from one of the boundaries to a center between the boundaries of the first block, and one of the second sense amplifiers is connected to bit lines arranged in the direction from a center between the boundaries to one of the boundaries of the second block, and the one of the first sense amplifiers and the one of the first second sense amplifier are simultaneously selected.

* * * * *